(12) United States Patent
Macias et al.

(10) Patent No.: US 6,408,630 B2
(45) Date of Patent: *Jun. 25, 2002

(54) COMPUTER ENCLOSURE COOLING UNIT

(76) Inventors: Jose Javier Macias, 1138 Highland Dr., Grand Prairie, TX (US) 75051; Rogelio Hernandez Silva, 2508 N. Forty Cr. #111, Arlington, TX (US) 76006

( * ) Notice: Subject to any disclaimer, the term of this patent is extended or adjusted under 35 U.S.C. 154(b) by 0 days.

This patent is subject to a terminal disclaimer.

(21) Appl. No.: 09/756,896

(22) Filed: Jan. 9, 2001

Related U.S. Application Data

(63) Continuation of application No. 09/434,873, filed on Nov. 4, 1999, now Pat. No. 6,196,003.

(51) Int. Cl.[7] .............................. F25B 21/02; H05K 7/20
(52) U.S. Cl. ........................ 62/3.7; 62/259.2; 361/687
(58) Field of Search .......................... 62/3.7, 259.2, 62/3.2; 361/687, 689, 690, 697, 727

(56) References Cited

U.S. PATENT DOCUMENTS

| | | |
|---|---|---|
| 2,984,077 A | 5/1961 | Gaskill |
| 4,665,707 A | 5/1987 | Hamilton |
| 5,079,618 A | 1/1992 | Farnworth |
| 5,422,787 A | 6/1995 | Gourdine |
| 5,724,818 A | 3/1998 | Iwata et al. |
| 5,731,954 A | 3/1998 | Cheon |
| 5,887,435 A | 3/1999 | Morton |
| 5,931,000 A | 8/1999 | Turner et al. |
| 5,931,002 A | 8/1999 | Nagashima |
| 5,955,955 A | 9/1999 | Corcoran, Jr. et al. |
| 6,038,128 A | 3/2000 | Hood, III et al. |
| 6,196,003 B1 * | 3/2001 | Macias et al. ............. 62/3.7 |

* cited by examiner

*Primary Examiner*—Chen-Wen Jiang
(74) *Attorney, Agent, or Firm*—Larry Mason Lee

(57) ABSTRACT

A computer enclosure cooling unit adapted to current dimensional standards which is capable of controlled cooling of individual semiconductor devices as well as of the air circulated within the computer housing. The disclosed invention utilizes Peltier devices, a controller unit, both liquid and gaseous heat exchangers, and low cost construction methods to provide a compact, effective computer enclosure cooling system meeting the cooling needs of current high-speed, heat producing computer systems and components.

11 Claims, 8 Drawing Sheets

COMPUTER ENCLOSURE COOLING UNIT

This is a continuation of U.S. application Ser. No. 09/434,873, filed Nov. 4, 1999, now U.S. Pat. No. 6,196,003.

BACKGROUND OF THE INVENTION a. Field of the Invention

The present invention is related generally to the field of computer enclosure cooling units. A substantial problem exists in keeping computer enclosures cooled. Typically a computer enclosure houses numerous semiconductor units, certain motorized units, and power supplies, all of which tend to be in varying degrees inefficient and therefore heat producing. Semiconductor units typically have an optimal temperature operating range at or below room temperature (20 degrees Celsius). Most computer enclosures are air cooled with blowers or fans circulating air from the enclosure into the ambient of the room within which the computer enclosure is located.

More particularly the present invention is related to computer enclosure cooling units that utilize Peltier devices to enhance heat transfer out of the computer enclosure into the air circulated into the room ambient. Peltier devices are well known for the transfer of heat through the device induced by electric current flow. Such devices are known to be usefully adapted to enhance heat transfer out of individual semiconductor devices by conduction.

Yet more particularly, the present invention is related to computer enclosure cooling units utilizing Peltier devices that cool not only the individual semiconductor devices within the computer, but additionally cool the ambient air within the computer enclosure. As the operating speed of the various semiconductor devices within computers increases, the inefficiencies and thus the heat generation of the individual semiconductor devices, and in particular the central processing unit or CPU generates dramatic quantities of heat. The excess heat generated, in turn, degrades the operation of the individual semiconductor device further, where by a degenerative spiral of operating characteristics is encountered limiting the operating speed of the individual semiconductor unit and thus of the computer.

b. Description of the Prior Art

Computer enclosure cooling systems comprising fans and blowers are well known in the art. In fact, several improved blower systems have been developed which create a partial vacuum in the computer enclosure, or alternatively which provide specific ports for air flow into the computer enclosure from the room ambient, in order to increase the transfer of heat out of the computer enclosure into the room ambient. However, all such prior art blower and/or fan systems encounter a problem, the heat transfer efficiency out of the enclosure is limited by the temperature differential between the air inside the computer enclosure and the air in the room ambient.

Peltier devices and the use of Peltier devices to transfer heat out of individual semiconductor materials and devices is well known. Further, the use of Peltier devices in circuitry to used regulate temperatures of specific semiconductor devices is well known. However, transfer of heat out of the entirety of the enclosure, rather than just specific semiconductor devices is need for optimal cooling of the computer enclosure; in that the density of switches within a specific semiconductor device is a source of excessive heating and that the density of devices, both electronic and electrical, within the computer enclosure is yet another source of excessive heating.

Additionally well know are air circulation systems to transfer heat out of computer enclosures. Some of these air circulation systems have been constructed to conform to the physical standards set for computer drive bays. However, even the conformance of the air circulation system to the standards set for computer drive bays fails to address the need for focused cooling created by the high operating temperatures of currently available high-density semiconductor devices.

Finally, the use of refrigeration systems to cool the entirety of the ambient in the room containing the computer enclosure is well known. The expense of this approach is often prohibitive, as is the physical size and placement of the refrigeration system components.

SUMMARY OF THE INVENTION

The instant invention is of a computer enclosure cooling unit that utilizes Peltier devices to enhance heat transfer out of the computer enclosure and provides both cooling of the ambient air within the computer enclosure and cooling of selected individual semiconductor devices within the computer enclosure. The numerous problems noted in the prior art cooling systems and devices are addressed in the instant invention and the result is a highly effective, controllable system for cooling a computer enclosure which may be constructed in conformity with existing standards.

Accordingly, it is an object of this invention to provide a computer enclosure cooling unit which provides high efficiency cooling both of the air circulating generally within the computer enclosure and of the specific semiconductor devices most prolifically heat generating.

It is a further object of this invention to provide a computer enclosure cooling unit which uses the controllability of Peltier devices to regulate the temperature and heat exchange provided by the cooling unit to the computer enclosure and specific semiconductor devices.

It is a yet further object of this invention to provide a computer enclosure cooling unit which doesn't require increased air flow rates through the computer enclosure in order to provide adequate cooling of both the enclosure air and specific semiconductor devices.

It is a yet further and final object of this invention to provide a computer enclosure cooling unit which provides all of the above-described advantages at a low cost to manufacture, install and operate.

BRIEF DESCRIPTION OF THE DRAWINGS

While the novel features of the instant invention are set forth with particularity in the appended claims, a full and complete understanding of the invention can be had by referring to the detailed description of the preferred embodiment(s) which are set forth subsequently, and which are as illustrated in the accompanying drawings, in which:

DESCRIPTION OF THE PREFERRED EMBODIMENT(S)

Figure 1:
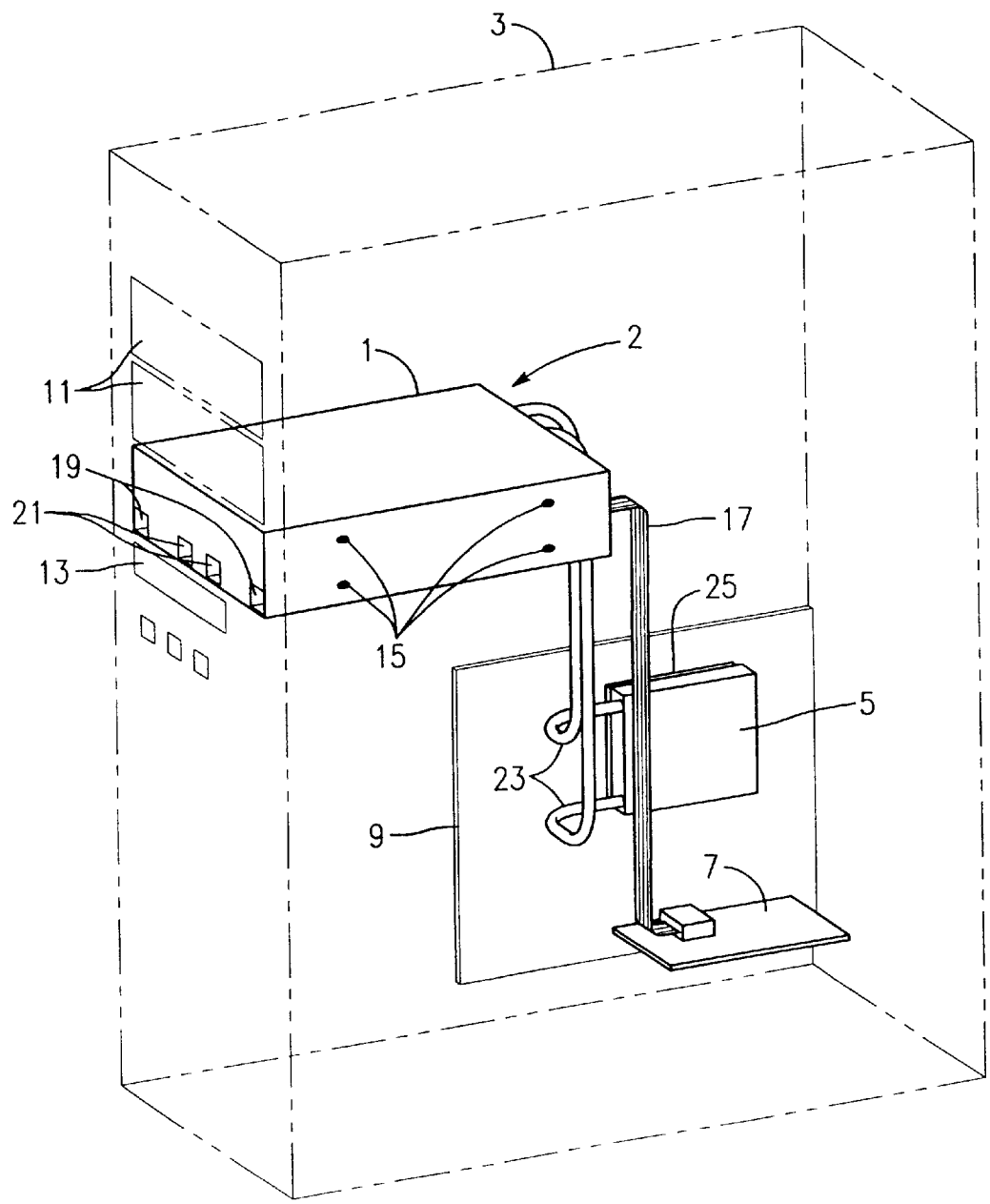
FIG. 1 is a perspective view of the Computer Enclosure Cooling Unit mounted within a Computer Housing.
Figure 2A:
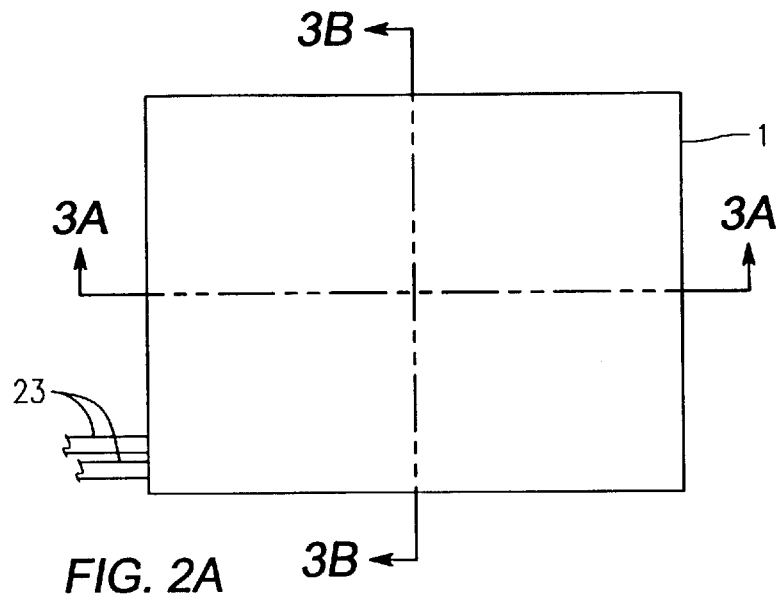
FIG. 2A is a top plane view of the Computer Enclosure Cooling Unit.
Figure 2B:
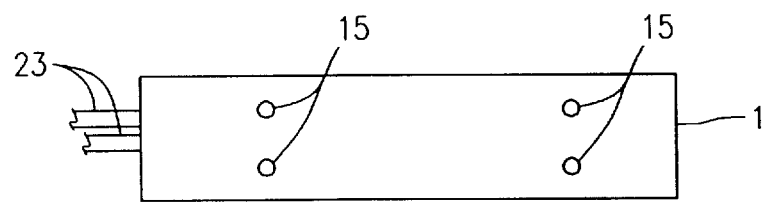
FIG. 2B is a lateral plane view of the Computer Enclosure Cooling Unit.
Figure 2C:
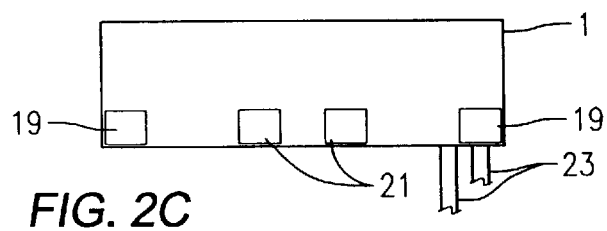
FIG. 2C is a front plane view of the Computer Enclosure Cooling Unit
Figure 2D:
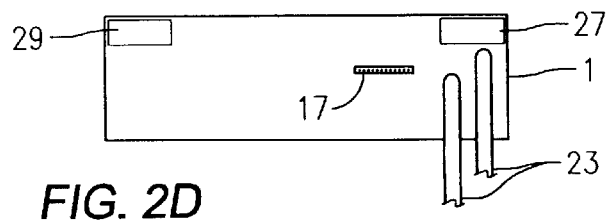
FIG. 2D is a rear plane view of the Computer Enclosure Cooling Unit.

As seen in FIG. 1, the instant invention is of a computer enclosure cooling unit 2. The instant invention, in use, as depicted in FIG. 1, would normally be installed into a standard 5.25 inch drive bay 11 in a computer housing 3. The dimensions of the computer enclosure cooling unit housing 1 are such that the unit may be readily mounted into the space allocated to a standard hard drive unit within a computer housing 3.

Numerous approaches to a solution of the heat generation problems present within computer housings 3 have been taken by the industry. The instant invention takes the approach of a bifurcated ventilation system, that is, the air circulating for heat exchange to the space outside the computer housing 3 does not mix with the air circulating for heat exchange within the computer housing 3. This is important as the humidity condensation created by the drying effect when the air internal to the computer housing 3 is cooled could destroy the operation of the electronic components within the computer housing 3. Additionally, the instant invention may include cooling of individual electronic components within the computer housing 3, as needed; and provides for a controller unit 7 which may control the temperature of air circulating within the computer housing 3 and the temperature of the cooling fluid or coolant flowing through the cooling fluid tubing 23 to the device heat exchanger 5, a liquid coolant heat exchanger which makes a direct, conductive heat exchange with the CPU 25 or other electronic component selected for individual cooling within the computer housing 3. The CPU 25 is shown in FIG. 1 to be mounted on a motherboard 9 which normally will provide for mounting of numerous other electronic and/or electrical components, any one or more of which electronic and/or electrical components may be the subject of individual cooling by connection of another set of cooling fluid tubing 23 to another device heat exchanger 5 which is disposed in heat conductive relationship thereto.

Also shown in FIG. 1 are the mounting holes 15, which facilitate connection of the computer enclosure cooling unit housing 1 to brackets within the computer housing 3 which are normally present to secure units inserted into one of the 5.25 inch drive bays 11; the ambient air heat exchanger air intake 19 which permits passage of air from the room ambient into the computer enclosure cooling unit 2; the ambient air heat exchanger air exhaust 21 which permits passage of air from within the computer enclosure 1 out to the room ambient; and the ribbon cable 17 which makes the electrical connection between the computer enclosure cooling unit 2 components and the controller unit 7.

FIGS. 2A, 2B, 2C, and 2D are plane views of the computer enclosure cooling unit housing 1 which show that to the rear of the computer enclosure cooling unit housing 1 are found the enclosure air cooling unit air intake 27 which permits air from within the computer housing 3 to flow into the computer enclosure cooling unit housing 1; and the enclosure air cooling unit air exhaust 29 which permits air from within the computer enclosure cooling unit housing 1 to flow out into the air within the computer housing 3.

Figure 3A:
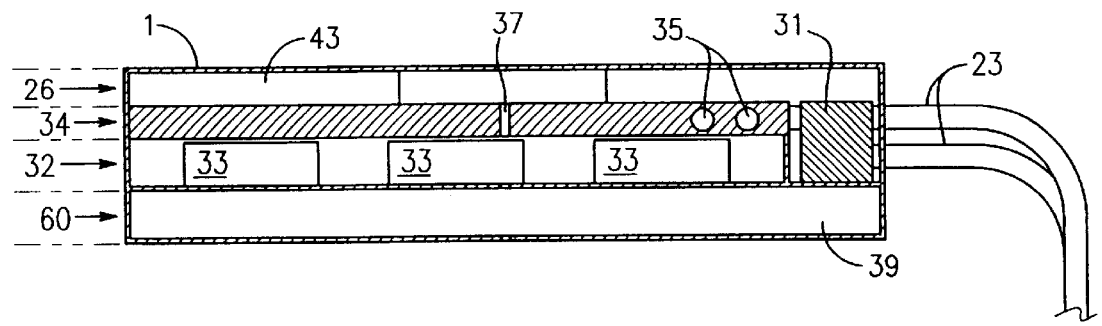
FIG. 3A is a sectional view of the Computer Enclosure Cooling Unit taken along the line 3A—3A, as shown in FIG. 2A.
Figure 3B:
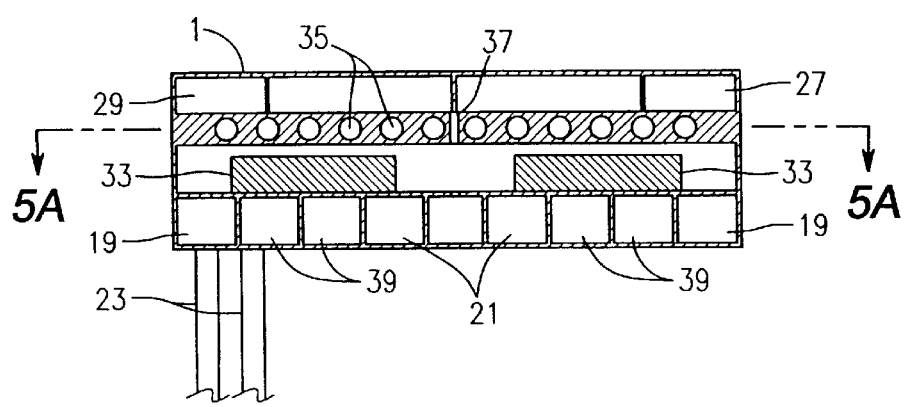
FIG. 3B is a sectional view of the Computer Enclosure Cooling Unit taken along the line 3B—3B, as shown in FIG. 2A.

FIGS. 3A and 3B are sectional views of the computer enclosure cooling unit 2 which show that the instant invention is constructed in essentially four layers, each of which is herein considered a sub-unit. Working from the top down, the first layer is the enclosure air cooling unit 26, the second layer is the cooling fluid cooling unit 34, the third layer is the Peltier heat exchange unit 32, and the fourth, or bottom, layer is the ambient air heat exchange unit 60.

Figure 4A:
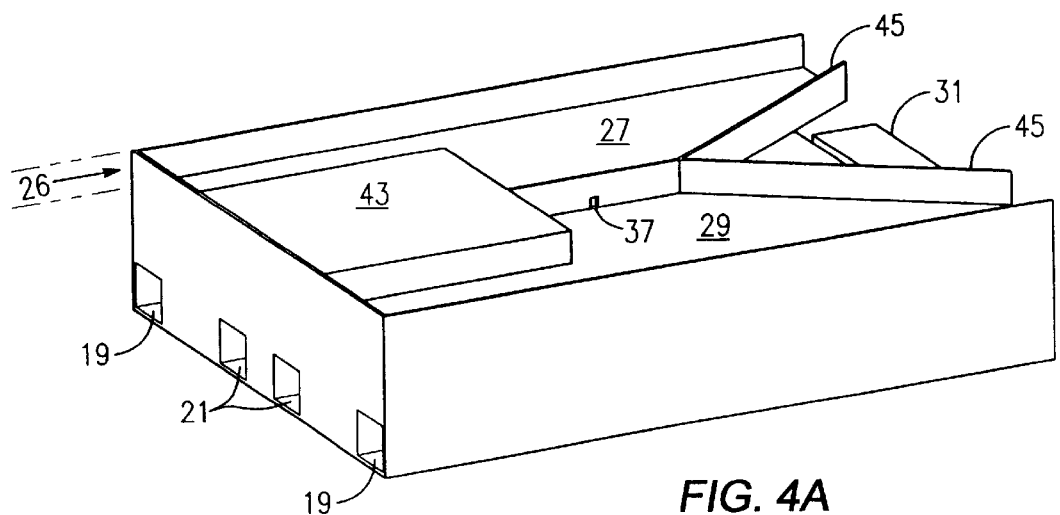
FIG. 4A is a cutaway perspective view of the Computer Enclosure Cooling Unit displaying the Enclosure Air Cooling Unit.
Figure 4B:
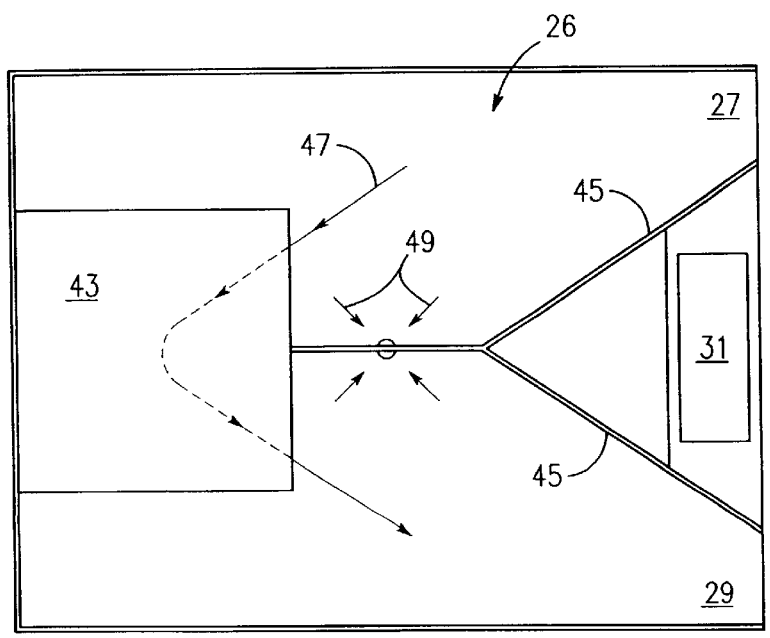
FIG. 4B is a vertical sectional view of the Computer Enclosure Cooling Unit displaying the Enclosure Air Cooling Unit.

The enclosure air cooling unit 26 is shown in detail in FIGS. 4A and 4B. The enclosure air cooling unit 26 comprises an enclosure air cooler blower unit 43, a enclosure air cooling unit air flow baffles 45, an enclosure air cooling unit air intake 27, and an enclosure air cooling unit air exhaust 29. FIG. 4B depicts the direction of air flow internal to the enclosure air cooling unit 26 by arrows 47. Also provided by the enclosure air cooling unit 26 is the upper aperture of a tubular condensate drain 37. The lower surface of the enclosure air cooling unit 26 is beveled, as indicated by the condensate drain flow arrows 49 in FIG. 4B, in the preferred embodiment to cause drainage of condensate from the cooled air within the enclosure air cooling unit 26, into the condensate drain 37, through the cooling fluid cooling unit 34 and the Peltier heat exchange unit 32, to be discharged into the ambient air heat exchanger 60 where the condensate is evaporated into the heated air and discharged into the ambient of the room containing the computer housing 3.

Figure 5A:
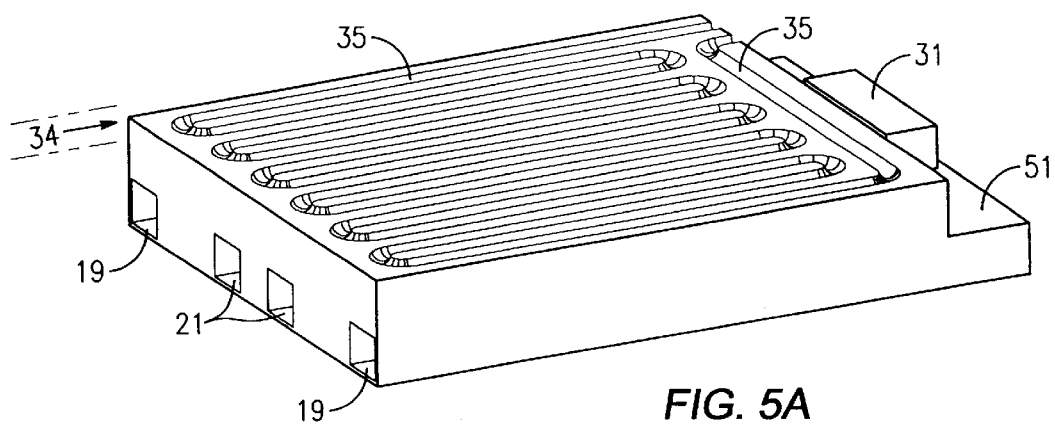
FIG. 5A is cutaway perspective view of the Computer Enclosure Cooling Unit with the Enclosure Air Cooling Unit removed to display the Cooling Fluid Cooling Unit.
Figure 5B:
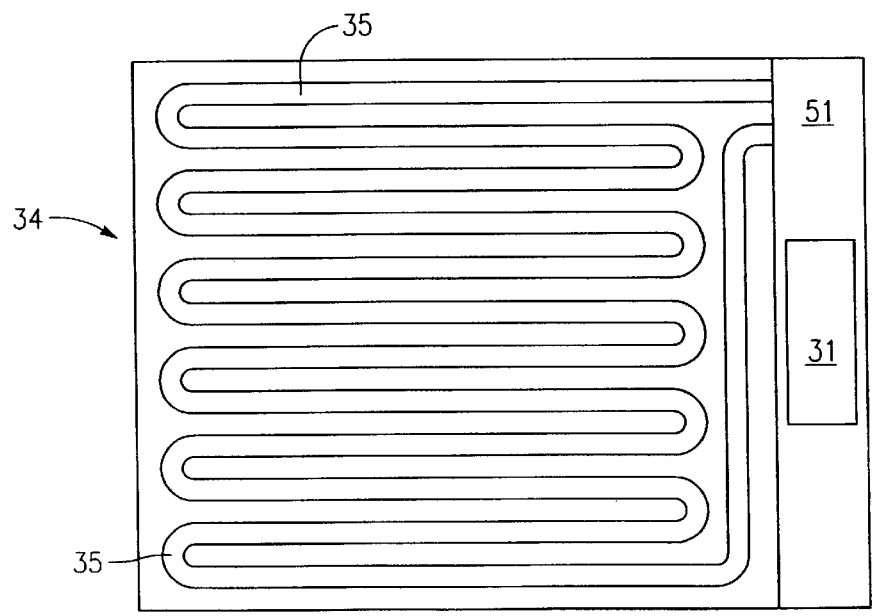
FIG. 5B is a vertical sectional view of the Computer Enclosure Cooling Unit with the Enclosure Air Cooling Unit removed to display the Cooling Fluid Cooling Unit.
Figure 6A:
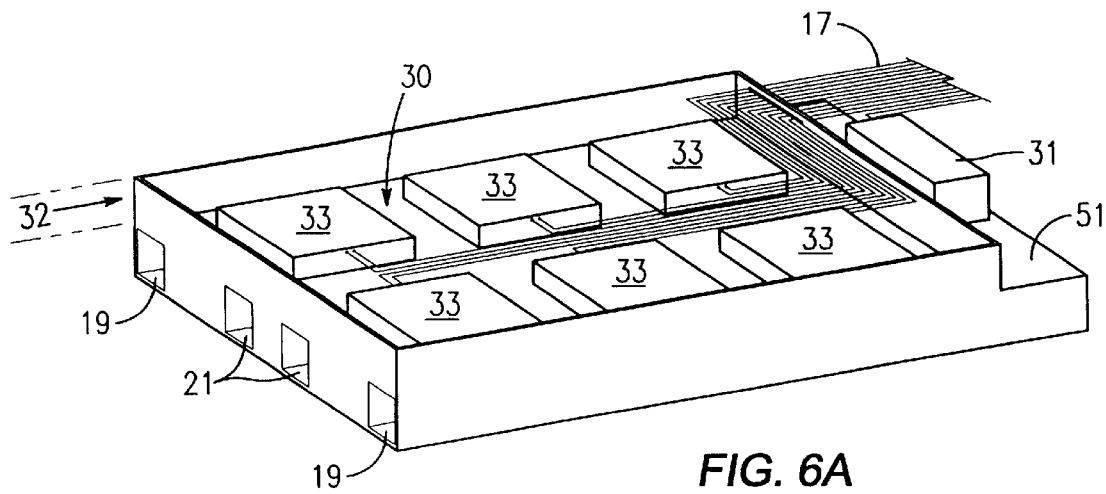
FIG. 6A is a cutaway perspective view of the Computer Enclosure Cooling Unit with the Enclosure Air Cooling Unit removed and the Cooling Fluid Cooling Unit removed, to display the Peltier Heat Exchange Unit.
Figure 6B:
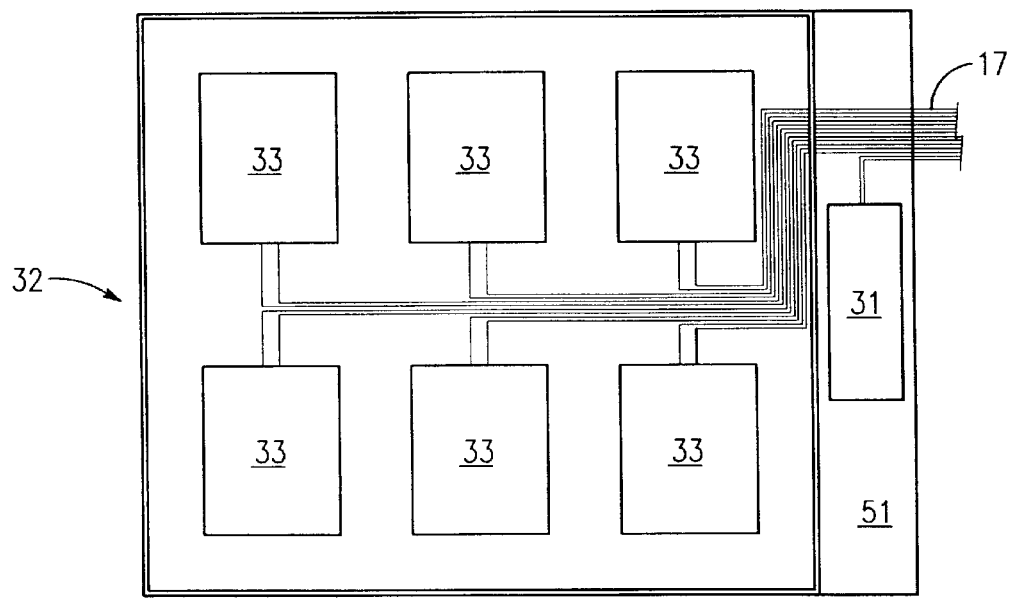
FIG. 6B is a vertical sectional view of the Computer Enclosure Cooling Unit with the Enclosure Air Cooling Unit removed and the Cooling Fluid Cooling Unit removed, to display the Peltier Heat Exchange Unit.

FIGS. 5A and 5B are two views of the cooling fluid cooling unit 34 of the preferred embodiment of the instant invention. The cooling fluid cooling unit 34 comprises a cooling fluid chamber 35, comprising the space between the enclosure air cooling unit 26 and the Peltier heat exchange unit 32 that is within the computer enclosure cooling unit housing 1, containing cooling fluid tubing 23 which is coiled within. The tubular cooling fluid chamber 35 of the preferred embodiment is in heat conductive contact with the cold side of the Peltier devices 33 contained in the Peltier heat exchange unit 32 as shown in FIGS. 6A and 6B; and further in heat conductive contact with the lower surface of the enclosure air cooling unit 26. The cooling fluid cooling unit 34 provides a pump 31 to circulate the cooling fluid within the cooling fluid tubing 23. Construction of the preferred embodiment provided a ledge 51 upon which the pump 31 was mounted within the cooling fluid cooling unit 34.

FIGS. 6A and 6B are two views of the Peltier plate 30 of the preferred embodiment. The Peltier plate 30 comprises a plurality of Peltier devices 33 in electrical communication with the controller unit 7 through the ribbon cable 17. The lower surface of the Peltier plate 30 is comprised of heat conductive material, metal in the preferred embodiment, and such lower surface is in heat conductive contact with the hot side of the Peltier devices 33.

Figure 7A:
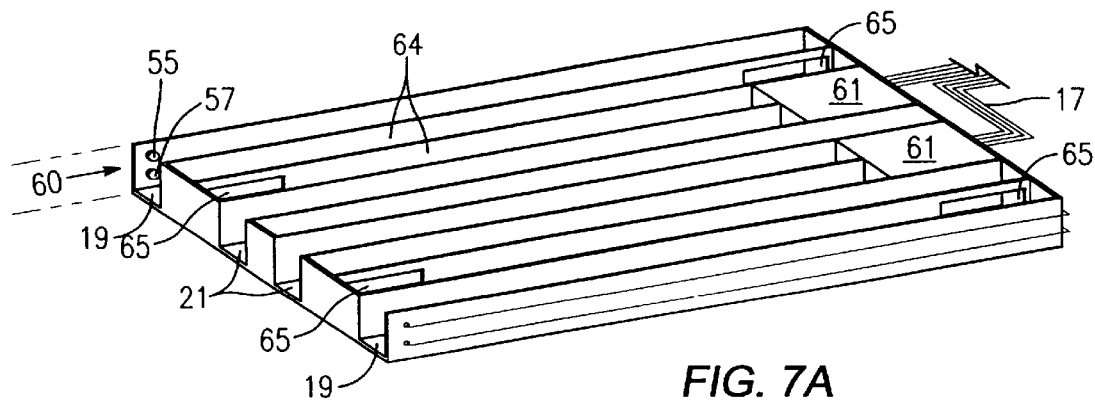
FIG. 7A is a cutaway perspective view of the Computer Enclosure Cooling Unit with the Enclosure Air Cooling Unit removed, the Cooling Fluid Cooling Unit removed, and the Peltier Heat Exchange Unit removed to display the Ambient Air Heat Exchange Unit.
Figure 7B:
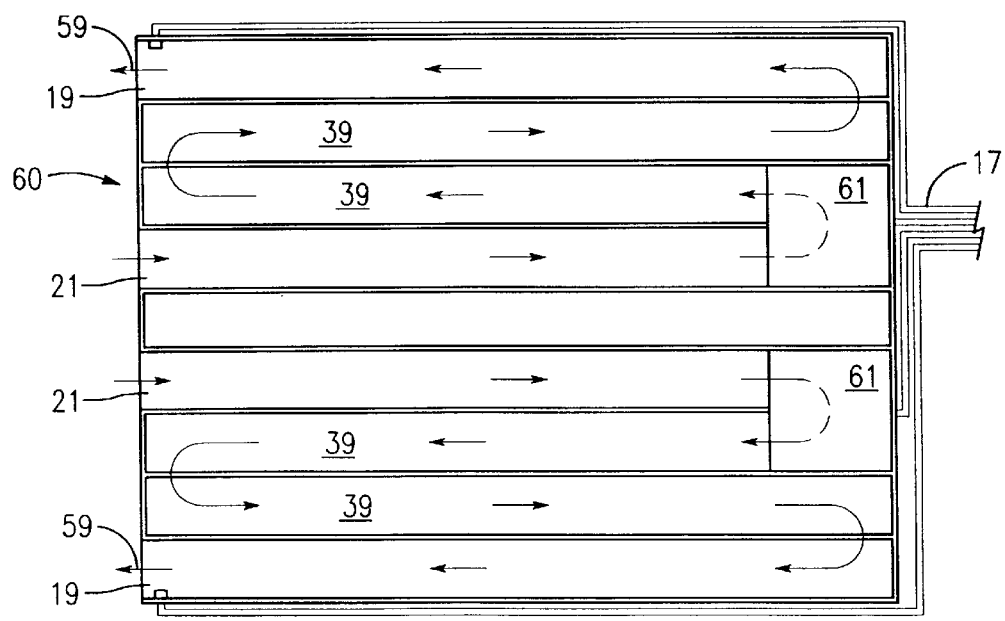
FIG. 7B is a vertical sectional view of the Computer Enclosure Cooling Unit with the Enclosure Air Cooling Unit removed, the Cooling Fluid Cooling Unit removed, and the Peltier Heat Exchange Unit removed, to display the Ambient Air Heat Exchange Unit.

FIGS. 7A and 7B are two views of the ambient air heat exchanger 60. The ambient air heat exchanger 60 provides, in the preferred embodiment, two ambient air heat exchanger blower units 61, ambient air heat exchanger internal walls 64, two ambient air heat exchanger air intakes 19, and two ambient air heat exchanger air exhausts 21. In the preferred embodiment, spacing between the ambient air heat exchanger internal walls 64 provides ambient air heat exchanger internal air flow chambers 39, and air flow, indicated by ambient air heat exchanger air flow arrows 59, is continuous between the ambient air heat exchanger internal air flow chambers 39 by passing through apertures 65 in the ambient air heat exchanger internal walls 64. All materials in the ambient air heat exchanger 60 are, in the preferred embodiment, comprised of heat conductive materials, arranged in a maze, and facilitate the transfer of heat from the hot side of the Peltier devices 33 into the air flow which discharges out of the ambient air heat exchanger air exhausts 21 into the room ambient.

Figure 8A:
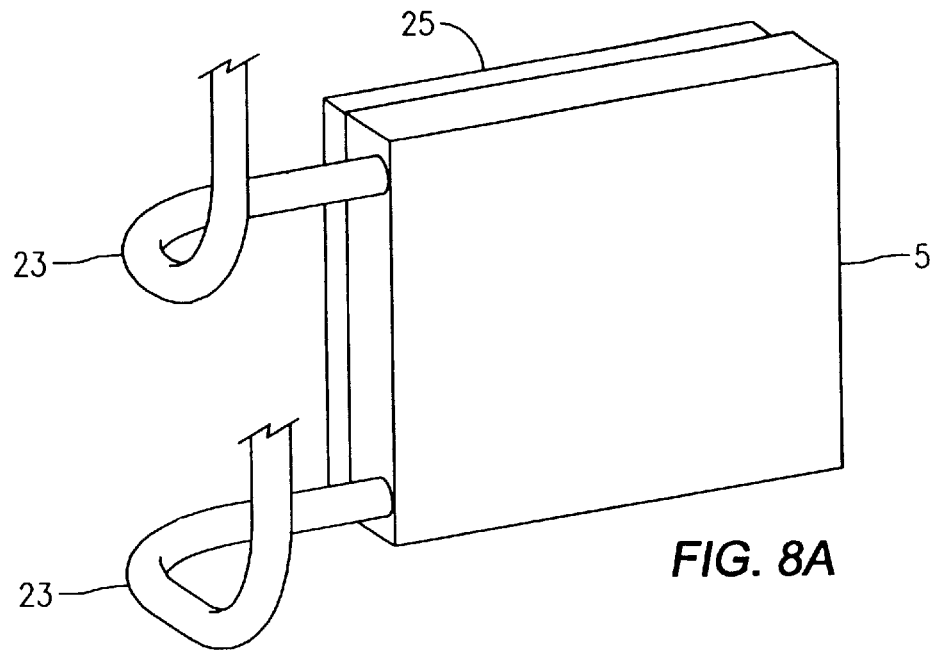
FIG. 8A is a perspective view of the Device Heat Exchange Unit mounted on a CPU.
Figure 8B:
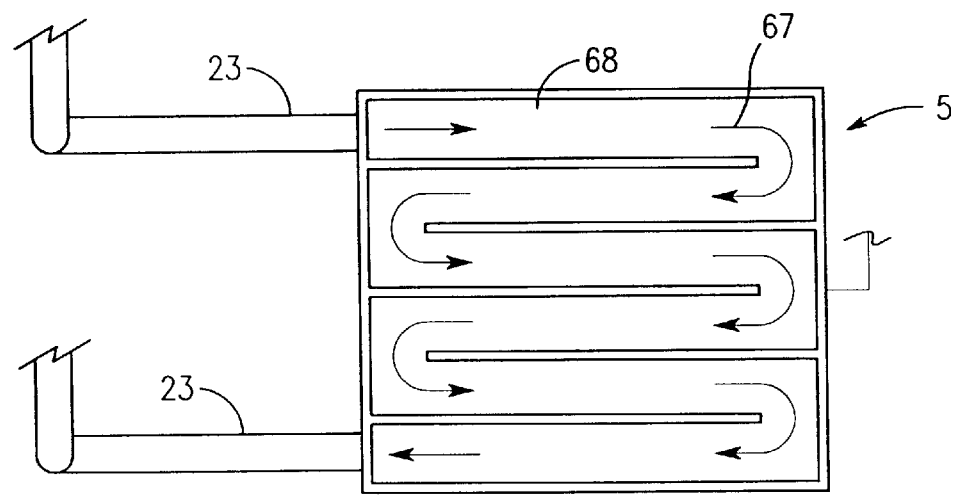
FIG. 8B is a vertical sectional view of the Device Heat Exchange Unit displaying the Device Cooling Fluid Chamber and fluid flow path.
Figure 8C:
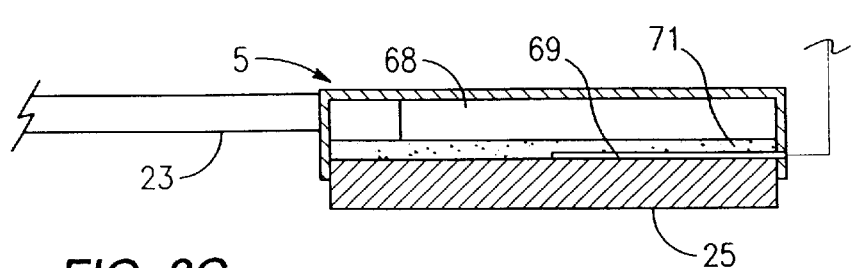
FIG. 8C is a horizontal sectional view of the Device Heat Exchange Unit mounted on a CPU.

FIGS. 8A, 8B and 8C are of the device heat exchanger 5 which, in the preferred embodiment is mounted on a CPU 25, although the particular semiconductor device upon which the device heat exchanger 5 is mounted may change with the needs of the particular computer being cooled. Additionally, there may be a plurality of device heat exchangers 5 with each such heat exchanger being mounted on a separate semiconductor device in a situation where multiple semiconductor devices within a particular computer housing 3 require individual cooling. Finally, it is contemplated that in another preferred embodiment, the device heat exchanger 5 may be integrally a part of the semiconductor device such that the semiconductor packaging includes a device heat exchanger 5 and fittings for attachment of cooling fluid tubing 23.

As seen in FIG. 8A, the cooling fluid flow within the cooling fluid tubing 23 is in fluid communication with the interior of the device heat exchanger 5. Such communication may be attained by attaching or connecting the cooling fluid tubing 23 to the device heat exchanger 5, or by simply having the cooling fluid tubing 23 be a continuous tubular construction with device cooling fluid chamber 68 within the device heat exchanger 5. In the preferred embodiment, as shown in FIG. 8B, the interior of the device heat exchanger 5 is a maze of fluid baffles creating a device cooling fluid chamber 68 which is designed to lengthen the path taken by the cooling fluid in order to maximize the heat transfer between the cooling fluid and the device heat exchanger 5 and thus to the thermal paste 71 and the CPU 25. FIG. 8C shows the attachment of the device heat exchanger 5 to the CPU 25 as being simply a pressed fit of the thermal paste 71, which fills a cavity in the bottom structure of the exterior of the device heat exchanger 5, onto the top of the CPU 25. This press fit of the thermal paste 71 onto the CPU 25 was chosen because many currently available CPUs 25 have a heat sink structure built onto their packaging in order to dissipate excessive heat. The thermal past 71 will conveniently mold itself around the heat sink structure. Additionally, a device temperature sensor 69 is shown in FIG. 8C of the preferred embodiment. The device temperature sensor 69 is in electrical communication with the controller unit 7 which uses various sensor feedbacks from the computer enclosure cooling unit 2 to control the speed of the enclosure air cooling unit blower unit 43, the speed of the pump 31, the speed of the ambient air heat exchanger blower unit 61, and the number of Peltier devices 33 which are turned on as well as the current flow through each such turned on Peltier device 33. The preferred embodiment of the computer enclosure cooling unit 2 includes several sensors, air flow sensors 55, air temperature sensors 57, and a device temperature sensor 69.

In operation, the preferred embodiment of the instant invention 2 heat is discharged from the computer enclosure cooling unit 2 and into the ambient of the room within which the computer housing 3 sits by circulating the ambient air from the room within which the computer housing 3 sits through the ambient air heat exchanger 60. By definition, the temperature of the ambient air of the room within which the computer housing 3 sits is room temperature, and a breakdown of the temperature control system in the room's ambient air outside the computer housing 3 is not expected to be compensated for by the instant invention although variation of the room's ambient air temperature can be compensated for over a large range of room temperatures by the instant invention. Typically, the ambient air in the room containing the computer housing 3 can be expected to have a reasonable humidity, something less than one hundred percent. Thus, the heat transfer from the computer enclosure cooling unit 2 to the ambient air within the room will cause an expansion of the heated air and a localized decrease in the humidity. This localized, within the ambient air heat exchanger 60, is utilized in the instant invention to evaporate the condensate drained into the ambient air heat exchanger 60 from the enclosure heat exchanger through the condensate drain 37. Additionally, the flow rate of the air circulating within the ambient air heat exchanger 60 may not be greater than the flow rate of the air circulating within the enclosure heat exchanger in order not to create a low pressure region at the lower end of the condensate drain 37 which would interfere with the preferred direction of condensate flow through the condensate drain. The hot side of the Peltier devices 33 are in heat transfer communication with the air circulating within the ambient air heat exchanger 60. In the preferred embodiment, this heat transfer communication is accomplished by construction of the Peltier plate 30 in such fashion that the hot side of the Peltier devices 33 are in physical contact with the heat conductive metal which simultaneously comprises the bottom of the Peltier plate 30 and top of the ambient air heat exchanger 60. Ambient room air circulated through the ambient air heat exchanger 60 is thereby heated by contact with the Peltier plate's 30 bottom surface which is the ambient air heat exchanger's 60 upper surface. Circulation of the air within the ambient air heat exchanger 60 is assured by the presence of the ambient air heat exchanger blower units 61 and the arrangement of air deflection baffles (the ambient air heat exchanger internal walls 64 of the preferred embodiment). Greater heat exchange may be achieved by numerous other arrangements of the air deflection baffles, but in the preferred embodiment the ambient air heat exchanger internal walls 64 (baffles) simply form a maze, lengthening the path taken by the circulating air, by using strips of sheet metal as the ambient air heat exchanger internal walls 64 with apertures 65, which are stamped out of the strips, for air flow in order to decrease construction costs.

The Peltier heat exchange unit 32 of the preferred embodiment comprises a Peltier plate 30 whose bottom surface is constructed of heat conductive metal to which the hot side of the Peltier devices 33 are physically mounted and a top surface constructed of heat conductive metal to which the cold side of the Peltier devices 33 are physically connected. Thus the Peltier heat exchange unit 32 simply transfers heat through the Peltier devices 33 from the top surface of the Peltier heat exchange unit 32 to the bottom surface of the Peltier heat exchange unit 32. The top surface of the Peltier heat exchange unit 32 is, in the preferred embodiment constructed of a heat conductive sheet of metal which also serves as the bottom surface of the cooling fluid cooling unit 32, a liquid coolant heat exchanger. The rate of heat transfer between the top surface of the Peltier heat exchange unit 32 and the bottom surface of the Peltier plate 30 and thus of the Peltier heat exchange unit 32 is controlled by the number of Peltier devices 33 that are switched on and the current flow that is provided to each individual Peltier device 33. The preferred embodiment provides a controller unit 7 which has as inputs the outputs of the various sensors within the computer enclosure cooling unit 1 and has as outputs the current supplied to the ambient air heat exchanger blower units 61, the current supplied to the pump 31, the current supplied to the enclosure air cooling blower unit 43, as well as the current supplied to each of the Peltier devices 33. All of the inputs and outputs of the controller unit 7 are electrically connected to the various sensors and controlled devices through the ribbon cable 17. The controller unit 7 of the preferred embodiment is a computer card containing programmable circuitry with a graphical user interface permitting the computer operator to make settings for optimum computer enclosure and semiconductor device temperatures. Clearly, the controller unit 7 may be as simple as a set of voltage and current dividers or switches preset to an average desirable set of operating conditions or as sophisticated as circuitry driven by artificial intelligence to continually adjust air flow rates, fluid flow rates, and the number, identity, and current flow through individual Peltier devices 33 in order to continually maintain optimal operating temperature for a particular semiconductor device and ambient air temperature within the computer housing 3.

While a single Peltier plate 30 is utilized in the preferred embodiment, the enhanced heat transfer between sub-units of the computer enclosure cooling unit 2 made possible by the Peltier devices 33 may be advantageously utilized between multiple sub-units. For example a Peltier plate 30 could additionally be inserted between the cooling fluid cooling unit 34 and the enclosure air cooling unit 26. Or, in a slightly different configuration, the heat conductive surface which is the lower surface of the cooling fluid cooling unit 34 in the preferred embodiment could be utilized for both fluid cooling and air cooling by either splitting the surface between the two functions or by interspersing the air circulation areas and the fluid circulation areas over the single heat conductive surface. In this fashion, there would be no distinct sub-unit for the enclosure air cooling unit 26, there would rather be a single combined enclosure air cooling unit 26 and cooling fluid cooling unit 34. For purposes of decreasing the height and space consumption of the computer enclosure cooling unit 2, such sharing of the heat conductive surface which is the lower surface of the cooling fluid cooling unit 34 may be advantageous. Such utilization of multiple Peltier plates 30 or of shared heat exchange surfaces do not depart from the teachings of the preferred embodiment.

The fluid heat exchanger (the cooling fluid cooling unit 34 of the preferred embodiment) is comprised of heat conductive tubing in physical contact with a floor which is the heat conductive sheet metal comprising the upper surface of the Peltier heat exchange unit 32 and with a ceiling which is the lower surface of the heat conductive sheet metal comprising the lower surface of the enclosure air cooling unit 26. Thus fluid cooling takes place by heat exchange from the cooling fluid to the heat conductive tubing (the cooling fluid chamber 35 of the preferred embodiment) in which the cooling fluid is contained, from the heat conductive tubing to the heat conductive sheet metal comprising the lower surface of the cooling fluid cooling unit 34, from the heat conductive lower surface of the cooling fluid cooling unit 34 to the cold side of the Peltier devices 33 that are in physical contact with the underside of the heat conductive sheet metal that is the lower surface of the cooling fluid cooling unit 34, across the Peltier devices 33 from the cold side to the hot side, from the hot side of the Peltier devices 33 to the lower surface of the Peltier plate 30, from the upper side of the heat conductive metal comprising the lower surface of the Peltier plate 30 to the air circulating within the ambient air heat exchanger 60, and from thence is exhausted out through the ambient air heat exchanger air exhaust 21 out into the ambient of the room containing the computer housing 3. The cooling fluid flow direction within the device heat exchanger 5 is shown in FIG. 8B by device cooling fluid flow arrows 67 thus the direction of fluid flow within the cooling fluid tubing 23 is defined. As seen in FIG. 3, the cooling fluid flows out of the cooling fluid cooling unit 34 of the computer enclosure cooling unit 2 through the cooling fluid tubing 23 and is circulated through a device cooling fluid chamber 68 (shown in FIG. 8) which is in heat exchange communication with a semiconductor device, in the preferred embodiment a single CPU 25. There may be, by obvious modification of the cooling fluid tubing 23, a plurality of the device heat exchangers 5 cooling a plurality of semiconductor devices. The device heat exchanger 5 of the preferred embodiment is simply a fluid flow maze whose baffles and walls are constructed of heat conductive material. Numerous baffle configurations may be utilized to optimize turbulence and/or lengthen the effective fluid flow path in order to optimize heat transfer between the cooling fluid and the heat conductive walls and baffles which form the device cooling fluid chamber 68 of the device heat exchanger 5. The device heat exchanger 5 is in heat exchange communication with the semiconductor device to be cooled or temperature controlled. The preferred embodiment monitors the temperature of the semiconductor device being cooled with the device temperature sensor 69 and utilizes thermal paste 71 to both affix the device heat exchanger 5 to the semiconductor device (CPU 25 in the preferred embodiment) being cooled and enhance heat transfer between the semiconductor device being cooled and the cooling fluid being circulated through the cooling fluid tubing 23 and the device cooling fluid chamber 68 within the device heat exchanger 5. Further, the thermal paste 71 serves to both put the device temperature sensor 71 in heat flow communication with the semiconductor device being cooled and to affix the device temperature sensor 71 to the device heat exchanger 5.

Heat flow communication between the cooling fluid within the cooling fluid cooling unit 34 and the heat conductive material comprising the lower surface of the enclosure air cooling unit 26 acts to provide a cool surface for heat exchange with the air circulating within the enclosure air cooling unit 26. The preferred embodiment, created with cost considerations foremost in mind, utilizes simple heat conductive sheet metal for the surfaces between the enclosure air cooling unit 26 and the cooling fluid cooling unit 34, between the cooling fluid cooling unit 34 and the Peltier plate 30, between the Peltier plate 30 and the ambient air heat exchanger 60, and for the construction of the computer enclosure cooling unit housing 1 which serves as the outer walls of all sub-units as well as the upper surface of the enclosure air cooling unit 26 and the lower surface of the ambient air heat exchanger 60. This construction of the computer enclosure cooling unit housing 1 from heat conductive sheet metal is consistent with current standardized size, shape and materials for peripherals intended to be installed, as the preferred embodiment is, in a 5.25 inch drive bay 11; but is non-optimal as the heat conductive sheet metal provides heat flow communication in a negative feedback loop around the various sub-units of the computer enclosure cooling unit 2 and thereby creates substantial inefficiencies. A second embodiment of the instant invention provides that the computer enclosure cooling unit housing 1 be constructed of non-heat conductive materials while maintaining the use of heat conductive material for the surfaces between the enclosure air cooling unit 26 and the cooling fluid cooling unit 34, between the cooling fluid cooling unit 34 and the Peltier plate 30, between the Peltier plate 30 and the ambient air heat exchanger 60.

The enclosure air cooling unit 26 of the preferred embodiment provides a minimum of air baffles for heat exchange to the air circulating within it. This construction has been found to be adequate to provide modest cooling of the interior of the computer housing 3. Current art for the cooling of the interior of computer housings 3 depends on air leakage into the enclosure formed by the computer housing 3 and fans to exhaust that air which is leaking in. Some prior art specifically provides for air flow into the enclosure formed by the computer housing 3 from the ambient in the room enclosing the computer housing 3. However, enhanced cooling of the interior of the computer housing 3 can be achieved by increasing the turbulence of the air and increasing the number and complexity of arrangement of the air baffles within the enclosure air cooling unit 26. Enhanced cooling of the air exhaust into the interior of the computer housing 3 from the enclosure air cooling unit 26 raises the possibility of condensate forming within the interior of the computer housing 3 and thereby creating shorts around the various electrical and electronic components therein. Such possibility of condensate forming is created by the interaction of the cool, partially dried, air exhaust into the interior of the computer housing 3 from the air exhaust 29 of the enclosure air cooling unit 26 with the relatively moist air leaking into the interior of the computer housing 3 from the ambient in the room containing the computer housing 3. This possibility of condensate formation within the interior of the computer housing 3 can be substantially eliminated through the use of positive air pressure within the interior of the computer housing 3. Positive air pressure would force air leakage out of the interior of the computer housing 3, thereby eliminating the source of humidity in the air interior to the computer housing 3. Positive air pressure can be achieved by moving the air input to the enclosure air cooling unit 26 such that it permits air intake from the ambient air in the room containing the computer enclosure rather than from the interior of the computer housing 3. Accordingly, a third embodiment of the instant invention provides for the enclosure air cooling unit air intake 27 to be located such that air is input to the enclosure air cooling unit 26 from the ambient air in the room containing the computer housing 3 and not from the interior of the computer housing 3. In the third embodiment, it is necessary that the local air circulation paths created within the ambient air of the room containing the computer housing 3 by the air intake to the enclosure air cooling unit 26 on the one hand and the air exhaust from the ambient air heat exchanger 60 on the other hand be kept apart and distinct.

Cooling of the air within the enclosure air cooling unit 26, whether configured as in the preferred embodiment or in the third embodiment, creates a condensate on the cooled surface(s) where the heat exchange with the circulating air takes place. In the preferred embodiment the lower surface of the enclosure air cooling unit 26 is beveled or sloped toward a condensate drain 37. The condensate drain 37 comprises a tube having its upper end opening in the lower surface of the enclosure air cooling unit 26 and its lower end opening in the upper surface of the ambient air heat exchanger 60. The condensate drain 37 is ideally comprised of non-heat conductive materials, alternatively, the condensate drain 37 may be heat insulated from the heat conductive surfaces that it passes through. Freezing of the condensate within the tube comprising the condensate drain 37 as it passes through the upper surface of the Peltier plate 30 must be avoided. A yet third, and not as desirable, solution to avoid condensate freezing is to make the tubing comprising the condensate drain 37 highly heat conductive such that efficiency of the Peltier plate 30 is sacrificed in the vicinity of the condensate drain's 37 passage through the upper surface of the Peltier plate 30 by heat feedback from the lower surface of the Peltier plate 30.

A fourth embodiment of the instant invention provides that the air exhaust from the computer housing 3, having been cooled by the air exhaust from the enclosure air cooling unit air exhaust 29, is input to the ambient air heat exchanger air intake 19. Thus a single path for air flow from and to the ambient air within the room containing the computer housing 3 is established. Greater efficiency of heat exchange over the entirety of the computer enclosure cooling unit 2 can be achieved by the fourth embodiment, but at a cost of increased tubing or piping to contain the flow of air from the air exhaust of the enclosure air cooling unit 26 to the ambient air heat exchanger air intake 19.

A yet fifth embodiment of the instant invention provides that both the air exhaust from the computer housing 3 is input to the ambient air heat exchanger air intake 19 and that the air intake to the enclosure air cooling unit 26 be positioned to permit air intake from the ambient air in the room containing the computer housing 3 and not from the interior of the computer housing 3. The fifth embodiment, in combination with the above-described possible enhancements to the air baffle configuration of the enclosure air cooling unit 26 provides a superior computer enclosure cooling unit 2, albeit at greater cost.

While the preferred embodiments of the instant invention have been described in substantial detail and fully and completely hereinabove, it will be apparent to one skilled in the art that numerous variations of the instant invention may be made without departing from the spirit and scope of the instant invention, and accordingly the instant invention is to be limited only by the following claims.

DESCRIPTION OF NUMERIC REFERENCES

1. Computer Enclosure Cooling Unit Housing
2. Computer Enclosure Cooling Unit
3. Computer Housing
5. CPU Cooler
9. Motherboard
7. Controller Unit
11. 5.25' Drive Bays
13. 3.5" Drive Bay
15. Mounting Holes
17. Ribbon Cable
19. Ambient Air Heat Exchanger Air Intake (Air Intake)
21. Ambient Air Heat Exchanger Air Exhaust (Air Exhaust)
23. Cooling Fluid Tubing
25. CPU
26. Enclosure Air Cooling Unit
27. Enclosure Air Cooling Unit Air Intake
29. Enclosure Air Cooling Unit Air Exhaust
30. Peltier Plate
31. Pump
32. Peltier Heat Exchange Unit
33. Peltier Device
34. Cooling Fluid Cooling Unit
35. Device Heat Exchanger
37. Condensate Drain
39. Ambient Air Heat Exchanger Air Flow Chamber
43. Enclosure Air Cooling Unit Blower Unit
45. Enclosure Air Cooling Unit Air Flow Baffles
47. Enclosure Air Cooling Unit Air Flow Arrows
49. Condensate Drain Flow Arrows
51. I" Ledge Created by Extended Lower Level
53. Pettier Wiring
55. Air Flow Sensor
57. Air Temp Sensor
59. Ambient Air Heat Exchanger Air Flow Arrows
60. Ambient Air Heat Exchanger
61. Ambient Air Heat Exchanger Blower Unit
63. Ambient Air Heat Exchanger Blower Unit Wiring
64. Ambient Air Heat Exchanger Internal Walls
65. Apertures in Ambient Air Heat Exchanger Internal Walls
67. Device Cooling Fluid Flow Arrows
68. Device Cooling Fluid Chamber
69. Device Temperature Sensor
71. Thermal Paste

What is claimed is:

1. An enclosure cooling unit which comprises
    a first heat exchanger,
    a second heat exchanger,
    a third heat exchanger, and
    one or more Peltier devices;
wherein
    said first heat exchanger transfers heat from said enclosure cooling unit to the ambient air outside said enclosure,
    said second heat exchanger transfers heat from the air within said enclosure to said enclosure cooling unit,
    said third heat exchanger transfers heat from cooling fluid circulating within said enclosure to said ambient air,
    said one or more Peltier devices transfer heat from said second heat exchanger to said first heat exchanger, and
    said one or more Peltier devices transfer heat from said second heat exchanger to said third heat exchanger.

2. The invention of claim 1 additionally comprising one or more additional heat exchangers
    Wherein said enclosure additionally contains one or more heat producing components, and
    Wherein each of said additional heat exchangers transfers heat from one or more of said heat producing components to said cooling fluid.

3. The invention of claim 1 additionally comprising a controller unit and sensors
    wherein said sensors detect various temperature and flow rates within said enclosure cooling unit,
    said sensors provide information regarding said detected temperature and flow rates to said controller,
    said controller provides voltages and currents to electrical and/or electronic components within said enclosure cooling unit, and
    said controller utilizes said detected temperature and flow rates to determine said voltages and currents.

4. An enclosure cooling unit comprising
    a first heat exchanger,
    a second heat exchanger,
    a third heat exchanger, and
    one or more Peltier devices;
wherein
    said first heat exchanger transfers heat from said enclosure cooling unit to the ambient air outside said enclosure,
    said second heat exchanger transfers heat from the air within said enclosure to said enclosure cooling unit,
    said third heat exchanger transfers heat from cooling fluid circulating within said enclosure to said enclosure cooling unit, and
    said one or more Peltier devices transfer heat from said second heat exchanger to said first heat exchanger.

5. The invention of claim 4 additionally comprising one or more additional heat exchangers
    wherein said enclosure additionally contains one or more heat producing components, and
    wherein each of said additional heat exchangers transfers heat from one or more of said heat producing components to said cooling fluid.

6. The invention of claim 4 additionally comprising a controller unit and sensors
    wherein said sensors detect various temperature and flow rates within said enclosure cooling unit,
    said sensors provide information regarding said detected temperature and flow rates to said controller,
    said controller provides voltages and currents to electrical and/or electronic components within said enclosure cooling unit, and
    said controller utilizes said detected temperature and flow rates to determine said voltages and currents.

7. An enclosure cooling unit comprising
    a first heat exchanger,
    a second heat exchanger,
    a third heat exchanger, and
    one or more Peltier devices;
wherein
    said first heat exchanger transfers heat from said enclosure cooling unit to the ambient air outside said enclosure,
    said second heat exchanger transfers heat from cooling fluid circulating within said enclosure to said enclosure cooling unit,
    said third heat exchanger transfers heat from the air within said enclosure to said cooling fluid, and said one or more Peltier devices transfer heat from said second heat exchanger to said first heat exchanger.

8. The invention of claim 7 additionally comprising one or more additional heat exchangers wherein said enclosure additionally contains one or more heat producing components, and wherein each of said additional heat exchangers transfers heat from one or more of said heat producing components to said cooling fluid.

9. The invention of claim 7 additionally comprising a controller unit and sensors wherein said sensors detect various temperature and flow rates within said enclosure cooling unit, said sensors provide information regarding said detected temperature and flow rates to said controller, said controller provides voltages and currents to electrical and/or electronic components within said enclosure cooling unit, and said controller utilizes said detected temperature and flow rates to determine said voltages and currents.

10. The invention of claim 7 wherein said one or more Peltier devices transfer heat from said third heat exchanger to said second heat exchanger.

11. The invention of claim 7 wherein said one or more Peltier devices transfer heat from said third heat exchanger to said first heat exchanger.

* * * * *